(12) United States Patent
Sasagawa

(10) Patent No.: US 8,797,077 B2
(45) Date of Patent: Aug. 5, 2014

(54) MASTER-SLAVE FLIP-FLOP CIRCUIT

(71) Applicant: Fujitsu Limited, Kawasaki (JP)

(72) Inventor: Ryuhei Sasagawa, Koto (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/921,732

(22) Filed: Jun. 19, 2013

(65) Prior Publication Data

US 2014/0077855 A1 Mar. 20, 2014

(30) Foreign Application Priority Data

Sep. 19, 2012 (JP) ................................. 2012-205838

(51) Int. Cl.
H03K 3/289 (2006.01)
(52) U.S. Cl.
USPC ........... 327/203; 327/202; 327/212; 327/218; 327/225
(58) Field of Classification Search
USPC ......... 327/202, 203, 208–214, 218, 219, 225; 326/93, 95–98
See application file for complete search history.

(56) References Cited

U.S. PATENT DOCUMENTS 4,779,011 A * 10/1988 Tsunoi et al. .................. 327/225
5,459,735 A * 10/1995 Narimatsu .................... 714/731
8,570,086 B2 * 10/2013 Hirairi .......................... 327/212
2005/0242861 A1 11/2005 Kanda et al.
2006/0220718 A1 10/2006 Kang et al.
2009/0219068 A1 9/2009 Mizuhashi et al.

FOREIGN PATENT DOCUMENTS

JP 2005-318479 A 11/2005
JP 2006-267906 A 10/2006
JP 2009-206852 A 9/2009

OTHER PUBLICATIONS

Fuketa et al., "Energy Efficiency Increase of Integer Unit Enabled by Contention-less Flip-Flops (CLFF) and Separated Supply Voltage Between Flip-Flops and Combinational Logics." The Institute of Electronics Information and Communication Engineers Technical Report, Aug. 2011, 9 pages.

* cited by examiner

Primary Examiner — Patrick O'Neill
(74) Attorney, Agent, or Firm — Arent Fox LLP

(57) ABSTRACT

A master-slave flip-flop circuit includes: a master circuit to receive input data in a first state of a reference clock and hold the input data in a second state of the reference clock to output intermediary data; and a slave circuit to receive the intermediary data in the second state and hold the intermediary data in the first state to output data, wherein the master circuit includes: a feedback two-input NOR gate to receive an output of the master circuit and a first clock; an input three-input NOR gate to receive the input data, a second clock, and a third clock; and a synthesis two-input NOR gate to receive an output of the input three-input NOR gate and an output of the feedback two-input NOR gate.

8 Claims, 12 Drawing Sheets

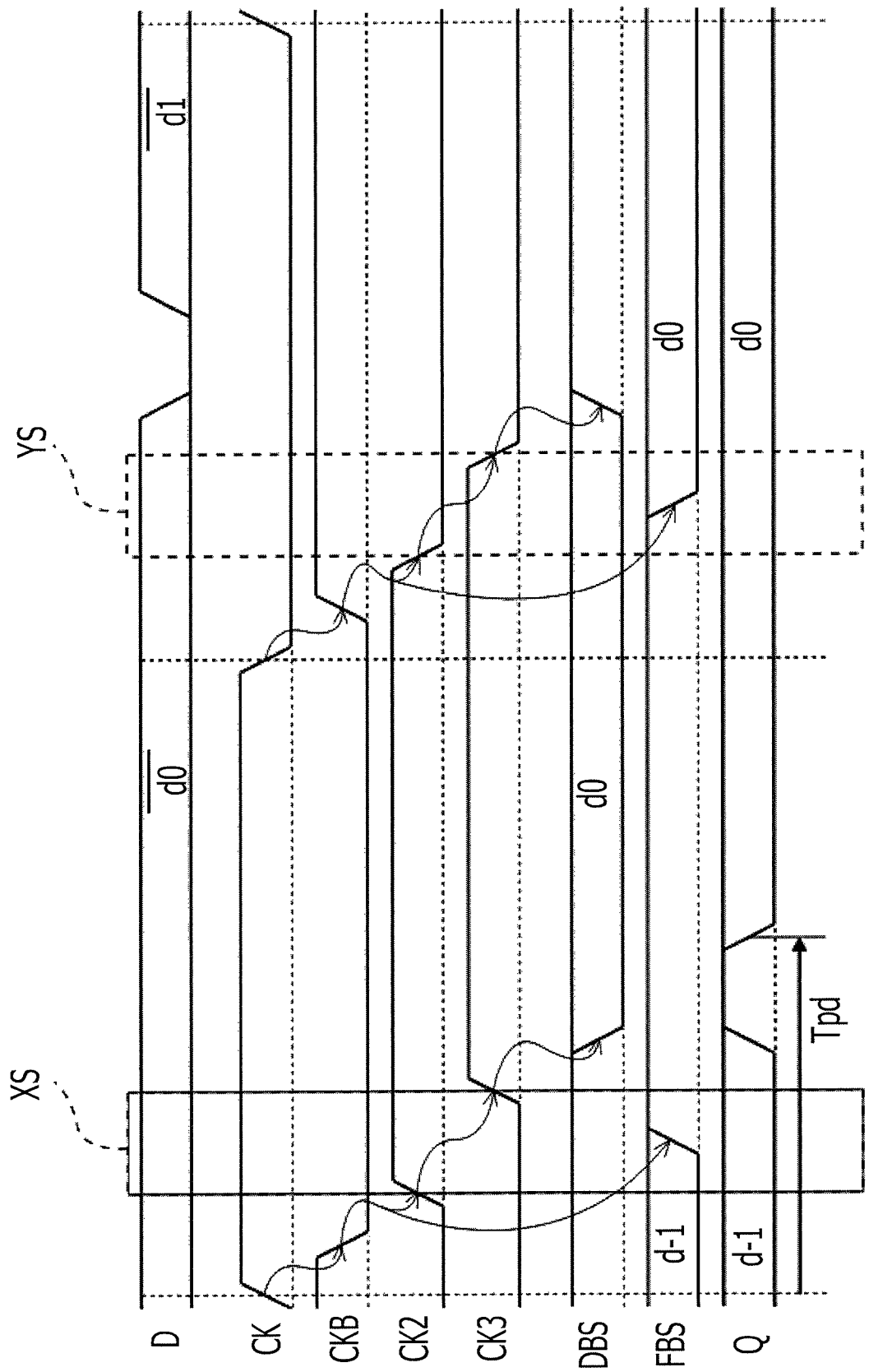

MASTER-SLAVE FLIP-FLOP CIRCUIT

CROSS-REFERENCE TO RELATED APPLICATION

This application is based upon and claims the benefit of priority of the prior Japanese Patent Application No. 2012-205838 filed on Sep. 19, 2012, the entire contents of which are incorporated herein by reference.

FIELD

The embodiments discussed herein are related to master-slave flip-flop circuits.

BACKGROUND

Related arts are discussed in Japanese Laid-open Patent Publication No. 2005-318479, Japanese Laid-open Patent Publication No. 2009-206852, Japanese Laid-open Patent Publication No. 2006-287906, or Fuketa Hiroshi, Hirairi Koji, Yasufuku Tadashi, Takamiya Makoto, Nomura Masahiro, Shinohara Hirofumi, Sakurai Takayasu, "Energy Efficiency Increase of Integer Unit Enabled by Contention-less Flip-Flops (CLFF) and Separated Supply Voltage between Flip-Flops and Combinational Logics." *IEICE Technical Report*, SDM2011-95, ICD2011-63, pp. 127-132, August 2011.

SUMMARY

According to one aspect of the embodiments, a master-slave flip-flop circuit includes: a master circuit configured to receive input data in a first state of a reference clock and hold the input data in a second state of the reference clock to output intermediary data; and a slave circuit configured to receive the intermediary data in the second state of the reference clock and hold the intermediary data in the first state of the reference clock to output data, wherein the master circuit includes: a feedback two-input NOR gate configured to receive an output of the master circuit and a first clock obtained by delaying the reference clock by a first delay amount that is less than a second delay amount and then inverted; an input three-input NOR gate configured to receive the input data, a second clock obtained by delaying the reference clock by the second delay amount, and a third clock obtained by delaying the reference clock by a third delay amount that is greater than the second delay amount; and a synthesis two-input NOR gate configured to receive an output of the input three-input NOR gate and an output of the feedback two-input NOR gate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 illustrates an example of operation waveforms in a slave unit.

DESCRIPTION OF EMBODIMENTS

Figure 1A:
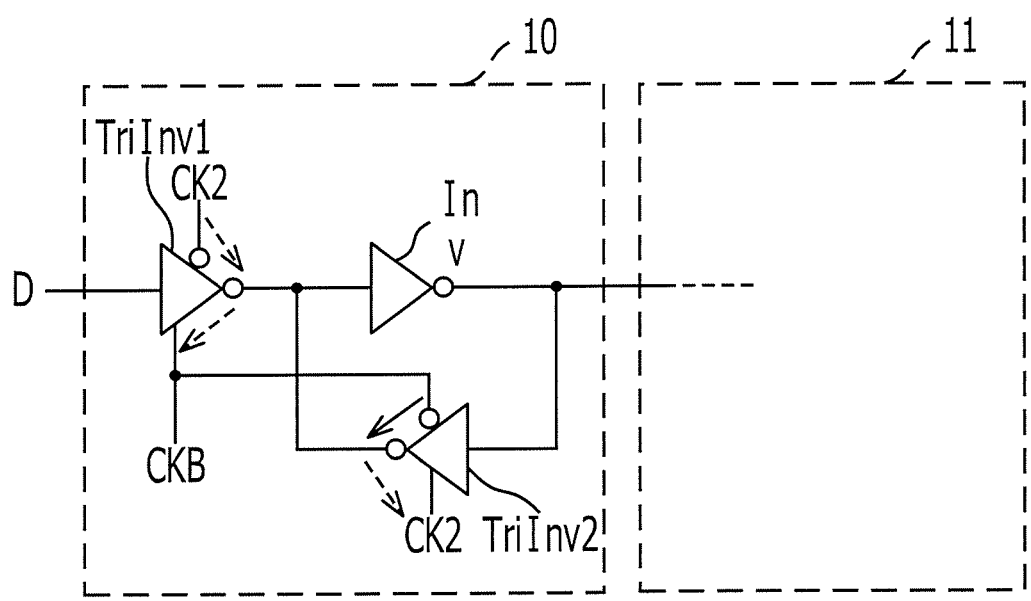
FIGS. 1A and 1B illustrate an example of a flip-flop.
Figure 1B:
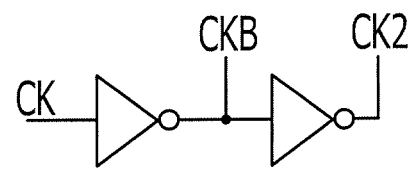

FIGS. 1A and 1B illustrate an example of a flip-flop. The flip-flop illustrated in FIGS. 1A and 1B uses a tri-state buffer (TB). The flip-flop includes an operation circuit unit illustrated in FIG. 1A and a clock generating circuit unit illustrated in FIG. 1B. When a plurality of flip-flops are to be used, a common clock generating circuit unit is provided.

The flip-flop illustrated in FIGS. 1A and 1B includes a master unit 10 and a slave unit 11. The master unit 10 and the slave unit 11 operate in synchronization with an inverted clock CKB where a reference clock CK is inverted and with a delay clock CK2 where CKB is further inverted.

The master unit 10 includes two tri-state inverters TriInv1 and TriInv2 and an inverter Inv. TriInv1 receives input data D as an input and operates in a phase that is the same as that of CKB and CK2. An output of TriInv1 is input to Inv, and an output of Inv is output to the slave unit 11 and also input to TriInv2. TriInv2 operates in a phase that is opposite to that of CKB and CK2, and an output of TriInv2 is input to Inv. TriInv1 and TriInv2 operate in opposite phases, and the outputs of TriInv1 and TriInv2 are coupled to each other through a wired OR connection and input to an input of Inv. The slave unit 11 has a substantially similar circuit configuration except in that CKB and CK2 are applied in reverse.

In the circuit illustrated in FIGS. 1A and 1B, when the outputs of the two tri-state inverters TriInv1 and TriInv2 are coupled to each other through a wired-OR connection and a significantly low voltage of approximately 0.5 V is used, skew between the complementary clock signals (CKB and CK2) to drive the tri-state inverters TriInv1 and TriInv2 may increase. When the skew between the complementary clock signals increases, contention between the outputs of the two tri-state inverters TriInv1 and TriInv2 may occur, and data in the slave unit 11 may damage data in the master unit 10. Malfunctioning may occur based on a P/N ratio in the drive performance of a PMOS transistor to an NMOS transistor determined through a manufacturing process, which may not allow 0/1 (L/H) inversion. Accordingly, the minimum operable voltage VDDmin at which the flip-flop normally operates may be set higher.

Figure 2A:
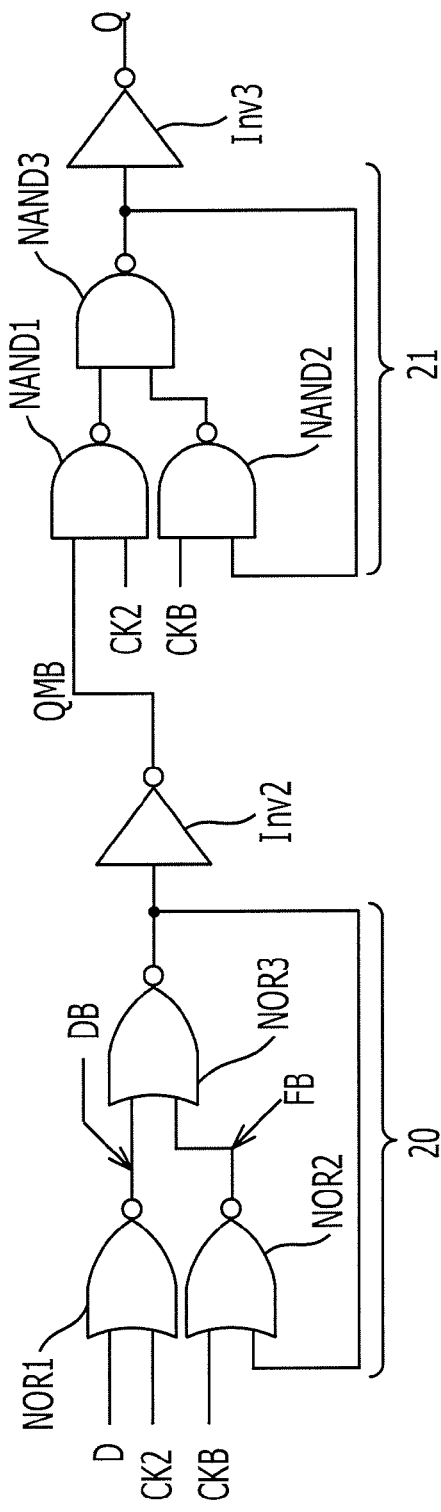
FIGS. 2A to 2D illustrate an example of a contentionless flip-flop (CLFF)
Figure 2D:
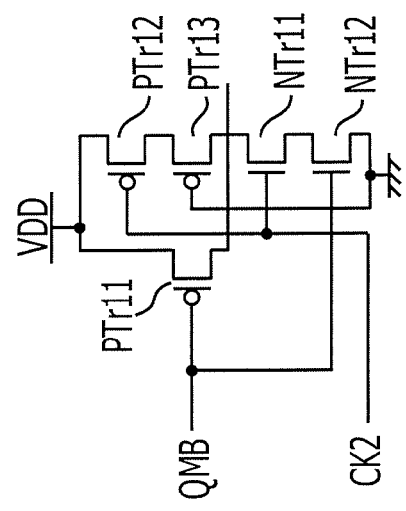
Figure 2C:
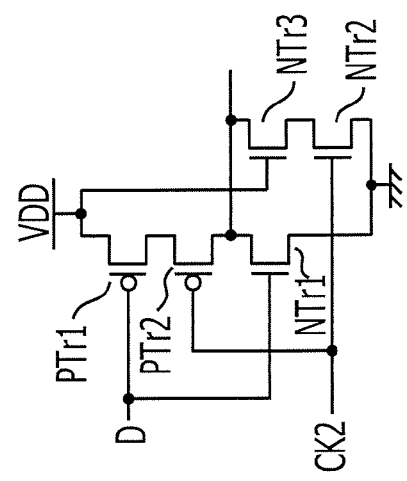
Figure 2B:
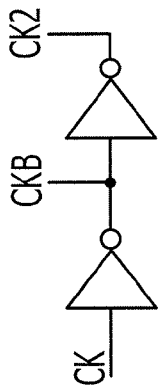

FIGS. 2A to 2D illustrate an example of a contentionless flip-flop (CLFF). FIG. 2A illustrates an operation circuit, FIG. 2B illustrates a clock generating circuit, FIG. 2C illustrates a NOR gate circuit at a data input section of a master unit, and FIG. 2D illustrates a NAND gate circuit at a data input section of a slave unit.

As illustrated in FIG. 2A, the CLFF includes a master unit 20, a slave unit 21, and two inverters Inv2 and Inv3. The master unit 20 includes three NOR gates NOR1 to NOR3. The slave unit 21 includes three NAND gates NAND1 to NAND3.

As illustrated in FIG. 2B, the clock generating circuit inverts a reference clock CK to generate an inverted clock CKB and further inverts CKB to generate a delay clock CK2.

NOR1 illustrated in FIG. 2C includes PMOS transistors PTr1 and PTr2 that are connected in series between a power supply terminal VDD and an output node, and an array of NMOS transistors NTr1, NTr2, and NTr3 that are connected in parallel between the output node and a power supply terminal VSS. Input data D is applied to gates of PTr1 and NTr1, CK2 is applied to gates of PTr2 and NTr2, and VDD is applied to a gate of NTr3, respectively.

NAND1 illustrated in FIG. 2D includes an array of PMOS transistors PTr11, PTr12, and PTr13 that are connected in parallel between a power supply terminal VDD and an output node, and NMOS transistors NTr11 and NTr12 that are connected in series between the output node and a power supply terminal VSS. QMB is applied to gates of PTr11 and NTr12, CK2 is applied to gates of PTr12 and NTr11, and VSS is applied to a gate of PTr13, respectively.

In the master unit 20, NOR1 receives the input data D and CK2 as inputs and supplies an output DB to NOR3. NOR2 receives CKB and an output of NOR3 as inputs and supplies an output FB to NOR3. NOR3 receives DB and FB as inputs and supplies an output to Inv2 and also to NOR2.

In the slave unit 21, NAND1 receives the output QMB of Inv 2 and CK2 as inputs and supplies an output to NAND3. NAND2 receives CKB and an output of NAND3 as inputs and supplies an output to NAND3. NAND3 receives the outputs of NAND1 and NAND2 as inputs and supplies an output to Inv3 and also to NAND2.

In the first half of CK, CK="low (L)" ("0"), CKB="high (H)" ("1"), and CK2=L. In the master unit 20, since CKB is H, the output FB of NOR2 becomes L. Since CK2 is L, the input data D passes through NOR1 and is inverted therein into DB. The input data D further passes through NOR3 and is inverted therein, and the output of NOR3 is set to the same value as the input data D. The output of NOR3 is inverted in Inv2 and then input to NAND1 of the slave unit 21. However, since CK2 is L, the output of NOR3 is not input to the slave unit 21 and enters a standby state. The output of NOR3 is fed back to NOR2. However, since CKB is H, there is no influence on FB. The input data D is set to the output of NOR3, which is an output of the master unit 20.

When CKB changes to L, in the master unit 20, NOR2 inverts the output of NOR3 into FB. FB becomes a value set in the master unit 20. Since CK2 changes to H after CKB changes to L, the output DB of NOR1 becomes L, and NOR3 holds a set value, for example, FB.

The output of NOR3 is inverted in Inv2 into QMB and input to NAND1 of the slave unit 21. In the slave unit 21, since CKB is L, an output of NAND2 becomes H. Since CK2 is H, QMB passes through NAND1 to be inverted therein and is input to NAND3. QMB further passes through NAND3 to be inverted therein, and thus an output of NAND3 is set to the same value as QMB. The output of NAND3 is inverted in Inv3 and then serves as an output of the flip-flop (FF).

As CK changes to L, CKB changes to H, and CK2 changes to L again, the operation described above is carried out. Each time CK changes, the operation described above is repeated. In CK=L, the master unit 20 sets input data, and the slave unit 21 holds most recently set data and outputs the data. In CK=H, the master unit 20 holds most recently set data and outputs the data, and the slave unit 21 sets the data QMB from the master unit 20.

The CLFF illustrated in FIG. 2A is a circuit in which NOR gates, NAND gates, and inverters are combined. In the CLFF, contention between the outputs of the tri-state inverters TriInv1 and TriInv2 as illustrated in FIG. 1A may not occur. The master unit 20 and the slave unit 21 illustrated in FIG. 2A has timing constraints. In the master unit 20, the timing constraints pertain to the nodes of DB and FB, and the master unit 20 sends a signal instructing reset on a DB side, for example, for example, a signal instructing change of DB to L after reset is released on an FB side, for example, for example, after FB has changed to set data. If, for example, DB is reset prior to the reset on the FB side being released, NOR3 does not hold a set value, which may lead to a malfunction. Accordingly, to delay the timing of reset on the DB side, as illustrated in FIG. 2C, NTr3, which stays in an ON state, is connected as a resistive element between NTr2, to which CK2 is applied, and the output node in NOR1, and thus the timing constraints are satisfied.

In the slave unit 21 as well, as illustrated in FIG. 2D, PTr13, which stays in an ON state, is connected between PTr12, which receives CK2, and the output node in NAND 1, and thus the timing constraints are satisfied.

When a power supply voltage is set to approximately 0.5 V, if a variation in the drive performance of a PMOS transistor and an NMOS transistor occurs in the manufacturing process, the timing constraints may not be satisfied. As the gate length of a transistor becomes longer, on-resistance increases, and thus the timing of reset on the DB side may be delayed. Accordingly, the timing constraints may be satisfied.

Figure 3A:
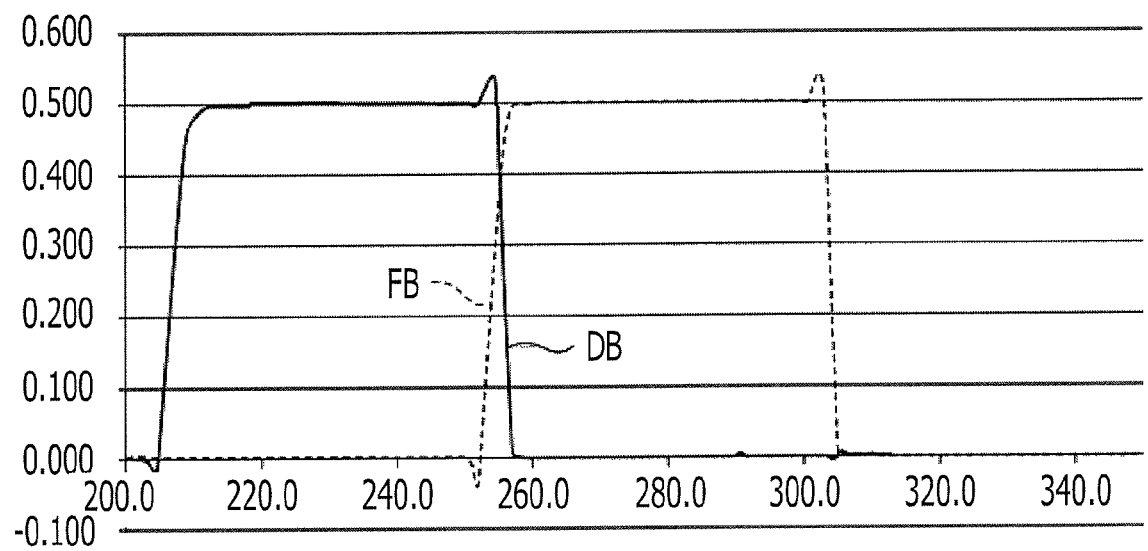
FIGS. 3A and 3B illustrate examples of timing constraints.
Figure 3B:
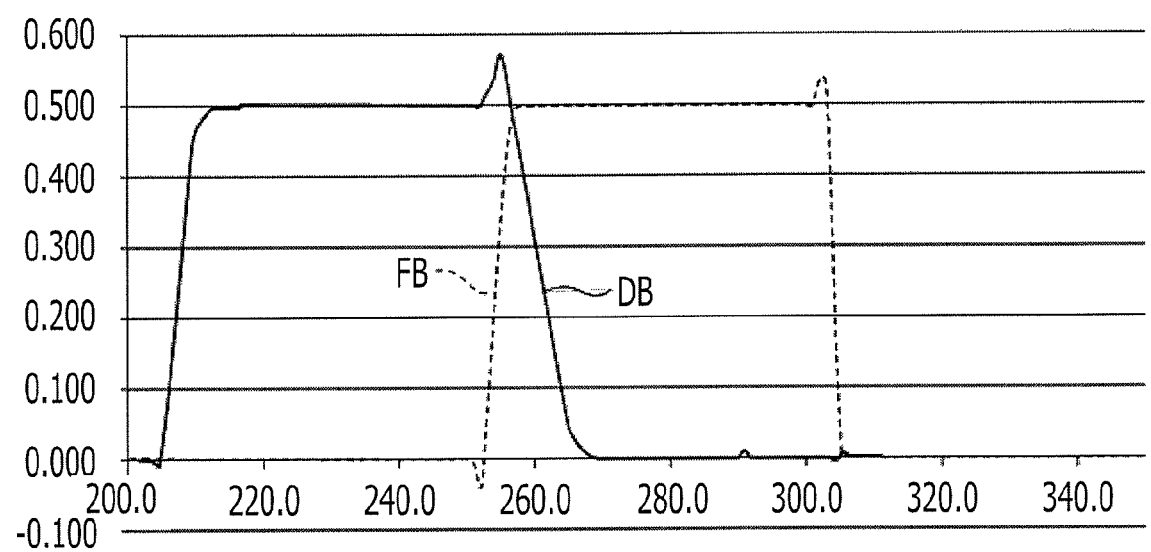

FIGS. 3A and 3B illustrate examples of the timing constraints. In FIGS. 3A and 3B, using a 65 nm process and at a power supply voltage of 0.5 V, the reset on the DB side is carried out after the reset on the FB side is released for different gate lengths L of the NMOS transistor NTr3, which stays in an ON state, in NOR1 of the master unit 20 illustrated in FIG. 2C. FIG. 3A illustrates changes in FB and DB in a case where NTr3 is formed through the 65 nm process to have L=0.06 µm. FIG. 3B illustrates changes in FB and DB in a case where NTr3 is formed to have L=1 µm.

In FIG. 3A, while FB is rising with the reset being released on the FB side, DB starts to fall with the reset on the DB side, and thus the timing constraints are not satisfied. In FIG. 3B, the gate length L is increased to 1 µm, and the channel resistance of NTr3 increases as well. DB starts to fall after FB stops rising, and thus the timing constraints are satisfied. The above similarly applies to PTr13 in NAND1 of the slave unit 21 illustrated in FIG. 2D.

Figure 4:
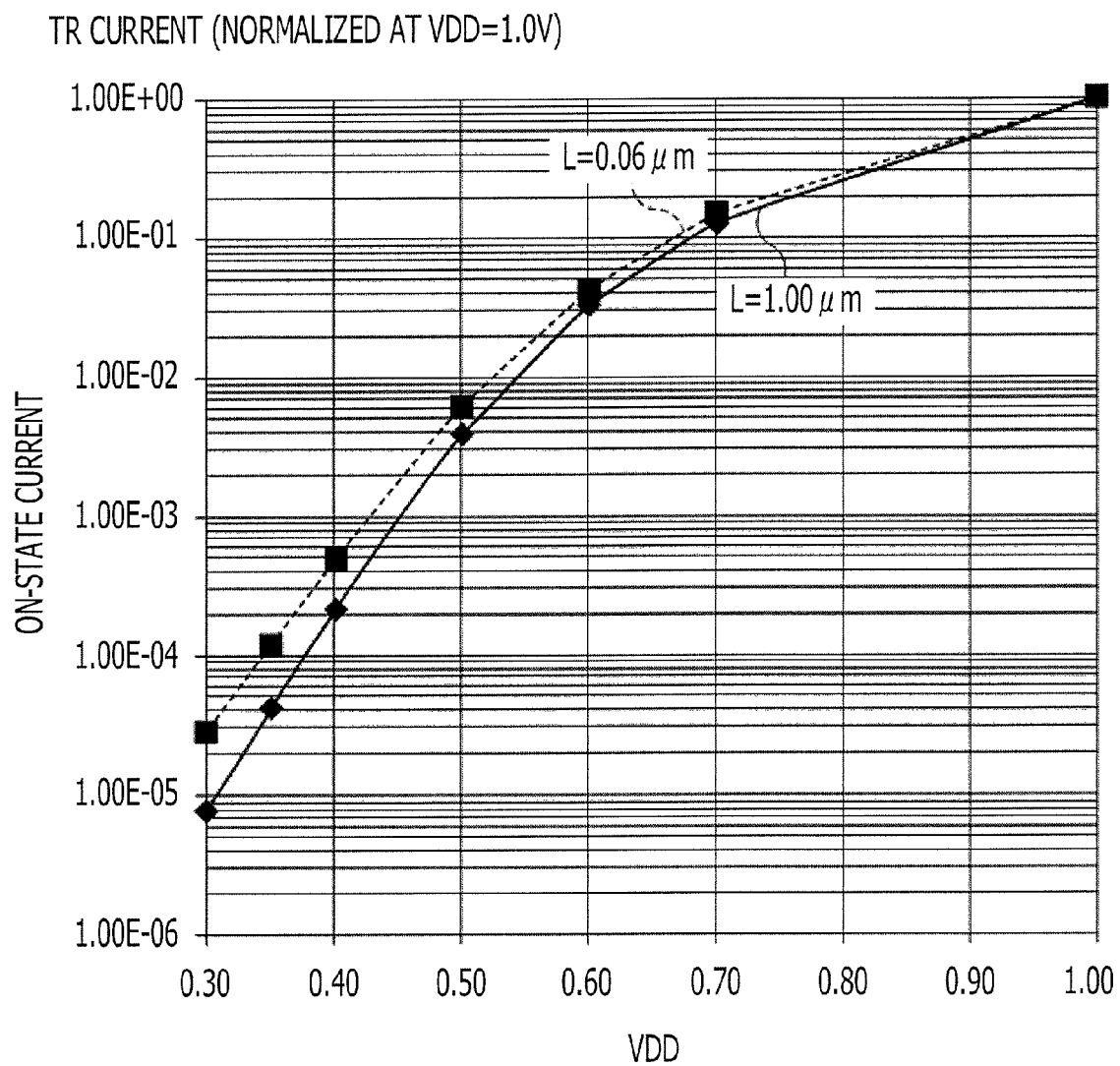
FIG. 4 illustrates an example of voltage dependence of an on-state current.

FIG. 4 illustrates an example of voltage dependence of an on-state current. FIG. 4 illustrates voltage dependence of an on-state current in two types of PMOS transistors respectively having L=0.06 µm and L=1 µm in a region where VDD=1.0 V or less. The on-state current is normalized at a numerical value of 1.0 V.

According to the characteristics illustrated in FIG. 4, the voltage sensitivity of the on-state current at 0.5 V or less is higher when L=1 µm than when L=0.06 µm. For example, a transistor having a greater L (longer gate) is susceptible to power supply noise at 0.5 V or less.

As illustrated in FIGS. 3A and 3B, in the CLFF illustrated in FIGS. 2A to 2D, L of a transistor that stays in an on state is increased to satisfy the timing constraints, but such a transistor may become susceptible to the power supply noise.

Figure 5A:
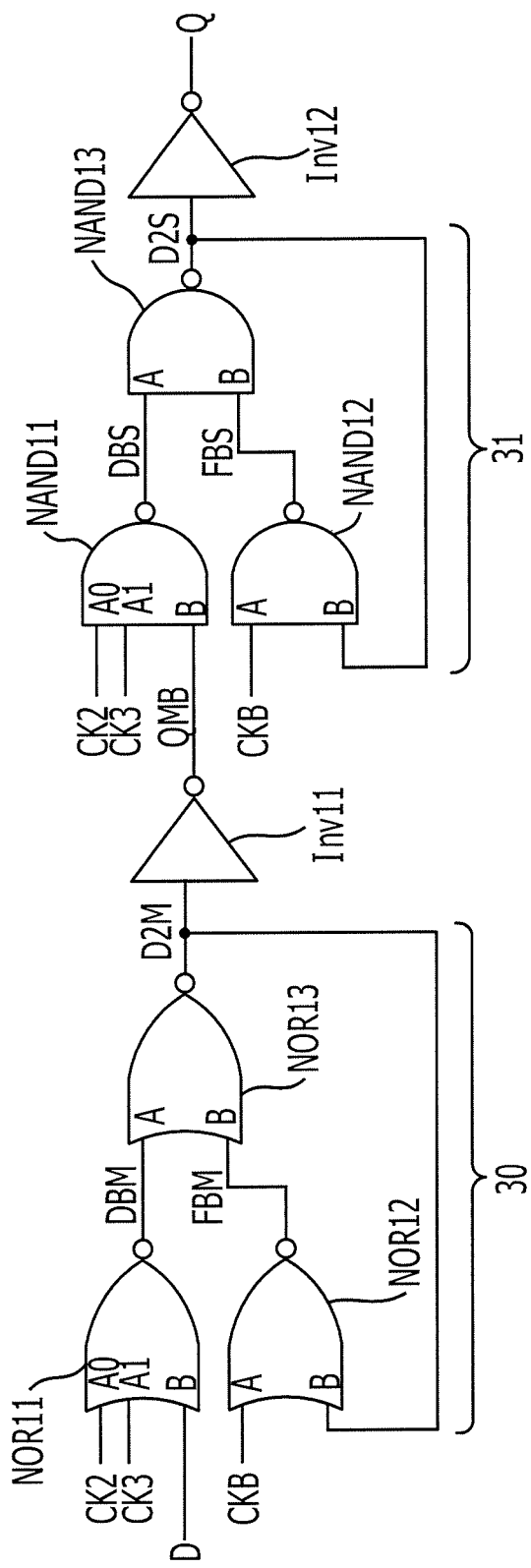
FIGS. 5A and 5B illustrate an example of a master-slave flip-flop circuit.
Figure 5B:
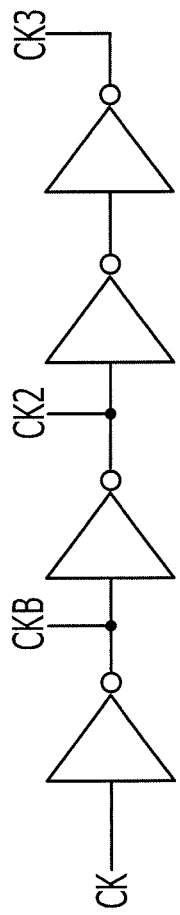

FIGS. 5A and 5B illustrate an example of a master-slave flip-flop circuit. FIG. 5A illustrates an operation circuit unit, and FIG. 5B illustrates a clock generating circuit unit.

As illustrated in FIG. 5B, the clock generating circuit unit includes four inverters that are connected in series. A first inverter inverts an input reference clock CK to generate CKB. A second inverter inverts CKB to generate CK2. Third and fourth inverters invert CK2 twice to generate CK3. Accordingly, CK2 and CK3 are signals that are in the same phase as CK, and CKB is an inverted signal that is in a phase that is opposite to that of CK, CK2, and CK3. The amounts of delay of CKB, CK2, and CK3 with respect to CK increase in this order. CKB, CK2, and CK3 may correspond to a first clock, a second clock, and a third clock, respectively.

The master-slave flip-flop circuit illustrated in FIG. 5A includes a master unit 30, a slave unit 31, and two inverters Inv11 and Inv12. The master unit 30 includes three NOR gates NOR11 to NOR13. The slave unit 31 includes three NAND gates NAND11 to NAND13. NOR11 may correspond to an input NOR gate, NOR12 may correspond to a feedback NOR gate, and NOR13 may correspond to a synthesis NOR gate, respectively. NAND11 may correspond to an input NAND gate, NAND12 may correspond to a feedback NAND gate, and NAND13 may correspond to a synthesis NAND gate, respectively.

NOR11 is a three-input NOR gate, and CK2, CK3, and input data D are input to input terminals A0, A1, and B, respectively. An output DBM of NOR11 is supplied to NOR13. NOR12 is a two-input NOR gate, and CKB and an output D2M of NOR13 are input to input terminals A and B, respectively. An output FBM of NOR12 is supplied to NOR13. NOR13 is a two-input NOR gate, and DBM and FBM are input to input terminals A and B, respectively. The output D2M of NOR13 is supplied to Inv11 and also to NOR12. Inv11 inverts D2M and supplies the result as QMB to the slave unit 31.

NAND11 is a three-input NAND gate, and CK2, CK3, and QMB from Inv11 are input to input terminals A0, A1, and B, respectively. An output DBS of NAND11 is supplied to NAND13. NAND12 is a two-input NAND gate, and CKB and an output D2S of NAND13 are input to input terminals A and B, respectively. An output FBS of NAND12 is supplied to NAND13. NAND13 is a two-input NAND gate, and DBS and FBS are input to input terminals A and B, respectively. The output D2S of NAND13 is supplied to Inv12 and also to NAND12. Inv12 inverts D2S and outputs output data Q.

The master-slave flip-flop circuit illustrated in FIGS. 5A and 5B may have a configuration similar to that of the contentionless flip-flop (CLFF) illustrated in FIGS. 2A to 2D. In FIGS. 5A and 5B, NOR11 of the master unit 30 and NAND11 of the slave unit 31 are three-input gates. Circuit elements aside from NOR11 and NAND11 in FIGS. 5A and 5B may be substantially the same as or similar to the circuit elements of the CLFF illustrated in FIGS. 2A to 2D.

Figure 6A:
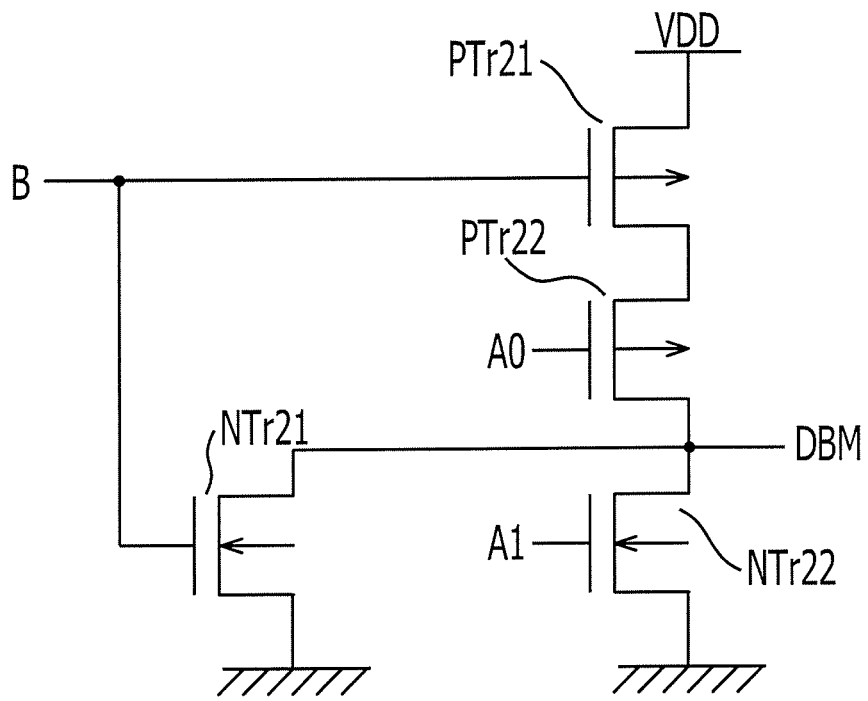
FIG. 6A illustrates an example of a NOR circuit.
Figure 6B:
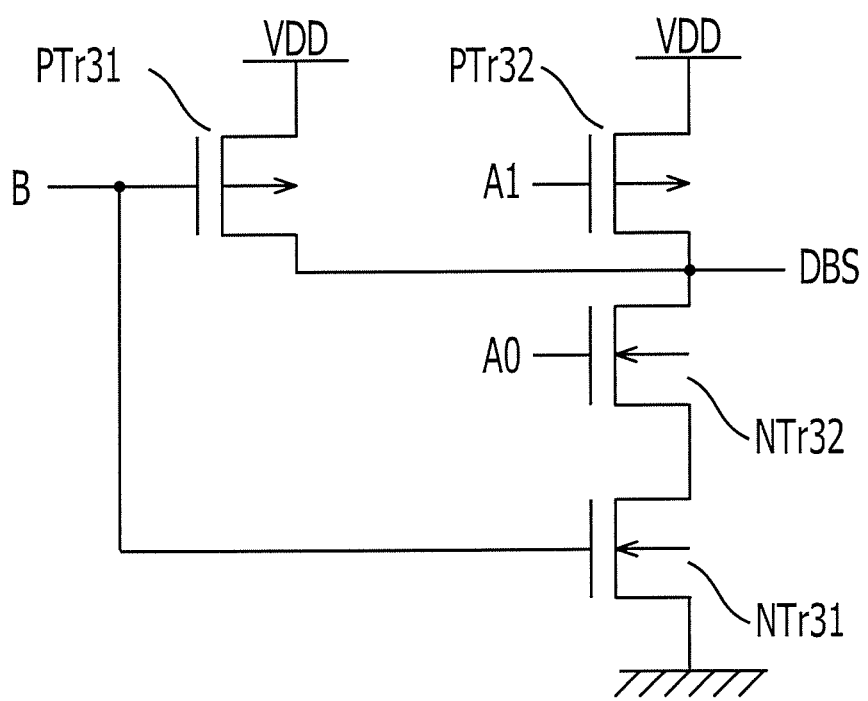
FIG. 6B illustrates an example of a NAND circuit.

FIG. 6A illustrates an example of a NOR circuit. FIG. 6A illustrates NOR11 of the master unit 30 illustrated in FIG. 5A. FIG. 6B illustrates an example of a NAND circuit. FIG. 6B illustrates NAND11 of the slave unit 31 illustrated in FIG. 5A.

NOR11 includes PMOS transistors PTr21 and PTr22 that are connected in series between a power supply terminal VDD and an output node, and NMOS transistors NTr21 and NTr22 that are connected in parallel between the output node and a power supply terminal VSS. Gates of PTr21 and NTr21 are connected to the input terminal B, and the input data D is input thereto. A gate of PTr22 is connected to the input terminal A0, and CK2 is input thereto. A gate of NTr22 is connected to the input terminal A1, and CK3 is input thereto. DBM is output from the output node. PTr21 and PTr22 may correspond, respectively, to first and second PMOS transistors of a master unit. NTr21 and NTr22 may correspond, respectively, to first and second NMOS transistors of a master unit.

NAND11 includes PMOS transistors PTr31 and PTr32 that are connected in parallel between a power supply terminal VDD and an output node, and NMOS transistors NTr31 and NTr32 that are connected in series between the output node and a power supply terminal VSS. Gates of PTr31 and NTr31 are connected to the input terminal B, and QMB is input thereto. A gate of PTr32 is connected to the input terminal A1, and CK3 is input thereto. A gate of NTr32 is connected to the input terminal A0, and CK2 is input thereto. PTr31 and PTr32 may correspond, respectively, to first and second PMOS transistors of a slave unit. NTr31 and NTr32 may correspond, respectively, to first and second NMOS transistors of a slave unit.

In the first half of CK, CK may be L ("0"), CKB may be H ("1"), CK2 may be L, and CK3 may be L. In the second half of CK, CK may be H, CKB may be L, CK2 may be H, and CK3 may be H. CK2 changes from L to H after CKB has changed from H to L and changes from H to L after CKB has changed from L to H. CK3 changes from H to L after CK2 has changed from H to L and changes from L to H after CK2 has changed from L to H.

In the first half of CK, in the master unit 30, since CKB is H, the output FBM of NOR12 becomes L. Since CK2 is L and CK3 is L, the input data D passes through NOR11 and is inverted therein into DBM. Since FBM is L, DBM further passes through NOR13 and is inverted therein, and thus the output D2M of NOR13 is set to the same value as the input data D. The output D2M of NOR13 is inverted in Inv11 and then input to NAND11 of the slave unit 31. However, since CK2 is L and CK3 is L, the output D2M of NOR13 is not input to the slave unit 31 and enters a standby state. The output D2M of NOR13 is fed back to NOR12. However, since CKB is H, there is no influence on FBM. The input data D is set to the output D2M of NOR13, which is an output of the master unit 30.

When CKB changes to L, CK2 changes to H, and CK3 changes to H, since CKB is L in the master unit 30, NOR12 inverts the output D2M of NOR13 into FBM. FBM changes to a value set in the master unit 30 in the first half of CK. Since CK2 changes to H and CK3 changes to H, the output DBM of NOR11 becomes L, and NOR13 holds FBM, for example, a set value.

The output D2M of NOR13 is inverted in Inv11 into QMB and input to NAND11 of the slave unit 31. Since CKB is L in the slave unit 31, the output FBS of NAND12 becomes H. Since CK2 is H and CK3 is H, QMB passes through NAND11 and is inverted therein to be output as DBS. DBS is input to NAND13, passes through NAND13, and is inverted therein. The output D2S of NAND13 is set to QMB. The output D2S of NAND13 is inverted in Inv12 and then serves as an output Q of the flip-flop (FF).

When CK changes to L, CKB changes to H, CK2 changes to L, and CK3 changes to L again, the operation described above is carried out. Each time CK changes, the operation described above is repeated. In CK=L, the master unit 30 sets input data, and the slave unit 31 holds the most recently set data and outputs the data. In CK=H, the master unit 30 holds the most recently set data and outputs the data, and the slave unit 31 sets the data QMB from the master unit 30.

The master-slave flip-flop circuit illustrated in FIGS. 5A and 5B may operate similarly to the CLFF illustrated in FIG. 2A.

For example, as for the timing constraints of the master unit 20 and the slave unit 21 illustrated in FIG. 2A, in FIG. 5A, the output DBM of NOR11 changes to L after the output FBM of NOR12 becomes a value corresponding to D2M as CKB changes from H to L. In NOR11 in FIG. 6A, when CK2 is L and CK3 is L, PTr22 is ON, NTr22 is OFF, and DBM becomes a value where the input data D input to the input terminal B is inverted. For example, if D=L, PTr21 and PTr22 are turned ON, NTr21 is turned OFF, and thus DBM becomes H. If D=H, PTr21 and PTr22 are turned OFF, NTr21 is turned ON, and thus DBM becomes L.

When CK2 changes from L to H, PTr22 is turned OFF (shut off). When D is L, PTr12 is ON, and NTr21 is OFF, and thus DBM is in a high impedance state. However, since CK3 then changes from L to H, NTr22 is turned ON, and thus DBM changes to L. CK3 is a clock where CK2 is delayed. CK3 is a signal that changes from L to H after CKB changes from H to L and further CK2 changes from L to H. For example, CK3 may be a clock that is delayed so as not to change to H before CKB changes to L even if there is a variation or the like in the manufacturing process. Accordingly, the timing at which CK3 changes to H and NOR11 is reset so that DBM changes to 0 comes after the timing at which CKB changes to L and the reset of NOR12 is released so that FBM is set to change to D2M. The timing constraints may reliably be satisfied.

When D is H, PTr21 is OFF, and NTr21 is ON, and thus DBM remains as L even if CK2 changes from L to H and PTr22 is turned OFF. Thereafter, DBM remains as L even if CK3 changes from L to H and NTr22 is turned ON. In this case, since D2M is H and FBM is L, D2M changes even if DBM remains as L, which, for example, may suppress damage and enable normal operation.

As for the timing constraints, in FIG. 5A, the output DBS of NAND11 changes to H after the output FBS of NAND12 becomes a value corresponding to D2S as CKB changes from L to H. In NAND11 illustrated in FIG. 6B, when CK2 is H and CK3 is H, PTr32 is OFF, NTr32 is ON, and thus DBS becomes a value where the intermediary data QMB input to the input terminal B is inverted. For example, if QMB=L, PTr31 is turned ON, NTr31 is turned OFF, and thus DBS becomes H. If QMB=H, PTr31 is turned OFF, NTr31 and NTr32 are turned ON, and thus DBS becomes L.

When CK2 changes from H to L, NTr32 is turned OFF. When QMB is H, PTr31 is OFF, NTr31 is ON, and thus DBS is in a high impedance state. Thereafter, since CK3 changes from L to H, PTr32 is turned ON, and thus DBS changes to H. CK3 is a clock where CK2 is delayed. CK3 is a signal that changes from H to L after CKB changes from H to L and further CK2 changes from L to H. For example, CK3 may be a clock that is delayed so as not to change to L before CKB changes to H even if there is a variation or the like in the manufacturing process. Accordingly, the timing at which CK3 changes to L and NAND11 is reset so that DBS changes to H comes after the timing at which CKB changes to H and the reset of NAND12 is released so that FBS is set to change to D2S. For example, the timing constraints may reliably be satisfied.

When QMB is L, PTr31 is ON, NTr31 is OFF, and thus DBS remains as H even if CK2 changes from H to L and NTr32 is turned OFF. Thereafter, DBS remains as H even if CK3 changes from H to L and PTr32 is turned ON. In this case, since D2S is L and FBS is H, D2S changes even if DBS remains as H, which, for example, may suppress damage and enable normal operation.

Figure 7A:
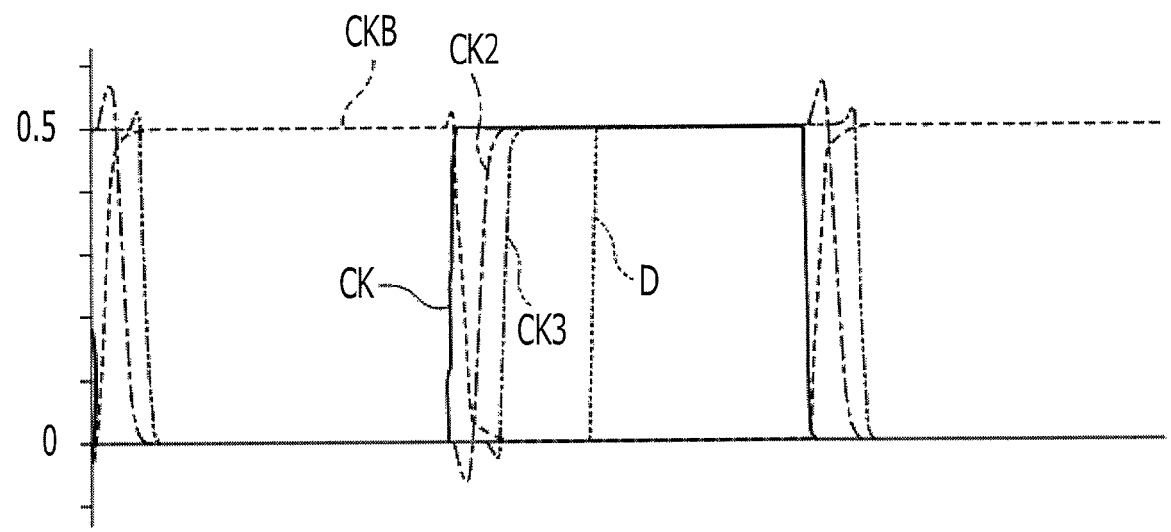
FIGS. 7A and 7B illustrate examples of operation waveforms.
Figure 7B:
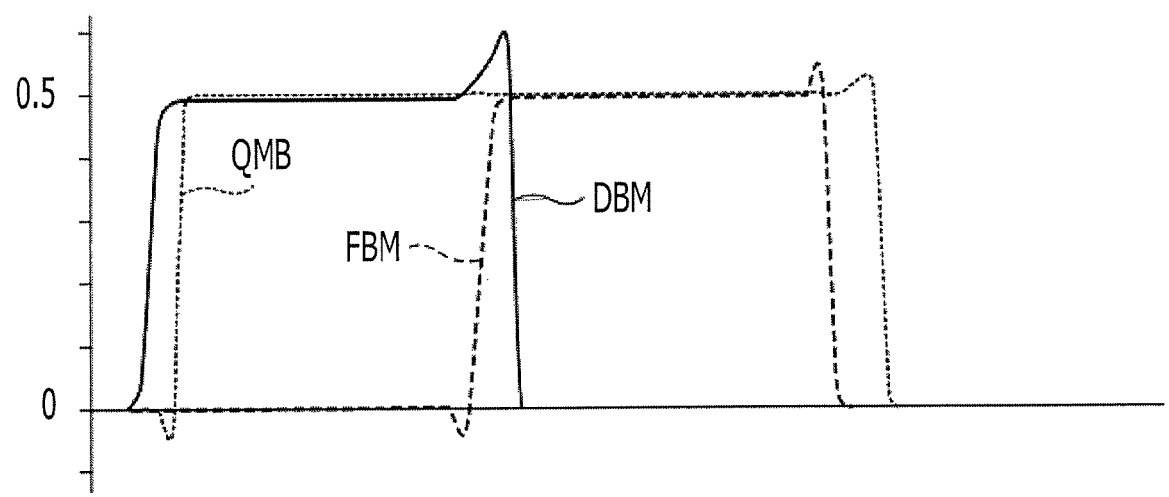

FIGS. 7A and 7B illustrate examples of operation waveforms. FIGS. 7A and 7B are timing charts illustrating operation waveforms in a case where the master-slave flip-flop circuit illustrated in FIGS. 5A and 5B is manufactured through the 65 nm process and operated at a power supply voltage of 0.5 V. FIG. 7A illustrates changes in CK, CKB, CK2, CK3, and the input data D. FIG. 7B illustrates changes in DBM, FBM, and QMB in the master unit 30.

As illustrated in FIG. 7B, in the master unit 30, DBM changes to 0 after FBM changes to H. The timing constraints may be satisfied. In the slave unit 31 as well, the timing constraints may similarly be satisfied.

The master-slave flip-flop circuit illustrated in FIGS. 5A and 5B includes NOR gates to which input data and CK2 are input and NAND gates to which intermediary data and CK2 are input and carries out the following operation. Accordingly, the timing constraints may be satisfied.

(1) In the clock generating circuit, a clock buffer to delay CK2 is provided to generate CK3 of the same phase where CK2 is further delayed.

(2) In FIGS. 2C and 2D, NTr3 and PTr13 that stay in an ON state and operate as resistors may not be provided.

(3) In the NOR gates to which the input data and CK2 are input, CK3 is applied to a gate by an NMOS transistor having a gate to which CK2 for resetting DBM is applied.

(4) In the NAND gate to which the intermediary data and CK2 are input, CK3 is applied to a gate by a PMOS transistor having a gate to which CK2 for resetting DBS is applied.

In the master-slave flip-flop circuit illustrated in FIGS. 5A and 5B, CK2 and the clock CK3 of the same phase where CK2 is further delayed are used in the NOR gate to which the input data is input and the NAND gate to which the intermediary data is input.

In NOR11 of the master unit 30, during a period in which CK2 changes from H to L and then CK3 changes from H to L, when the input data D is L, a through current may flow, although for a short period of time, in a path in PTr21, PTr22, and NTr22. In NAND11 of the slave unit 31 as well, during a period in which CK2 changes from L to H and then CK3 changes from L to H, when QMB is H, a through current may flow, although for a short period of time, in a path in PTr32, NTr32, and NTr31.

In NOR11 of the master unit 30, during a period in which CK2 changes from L to H and then CK3 changes from L to H, if the input data D changes from L to H, DBM may be reset to L by D. In NAND11 of the slave unit 31 as well, during a period in which CK2 changes from H to L and then CK3 changes from H to L, if the QMB changes from H to L, DBS may be reset to H by QMB.

Figure 8:
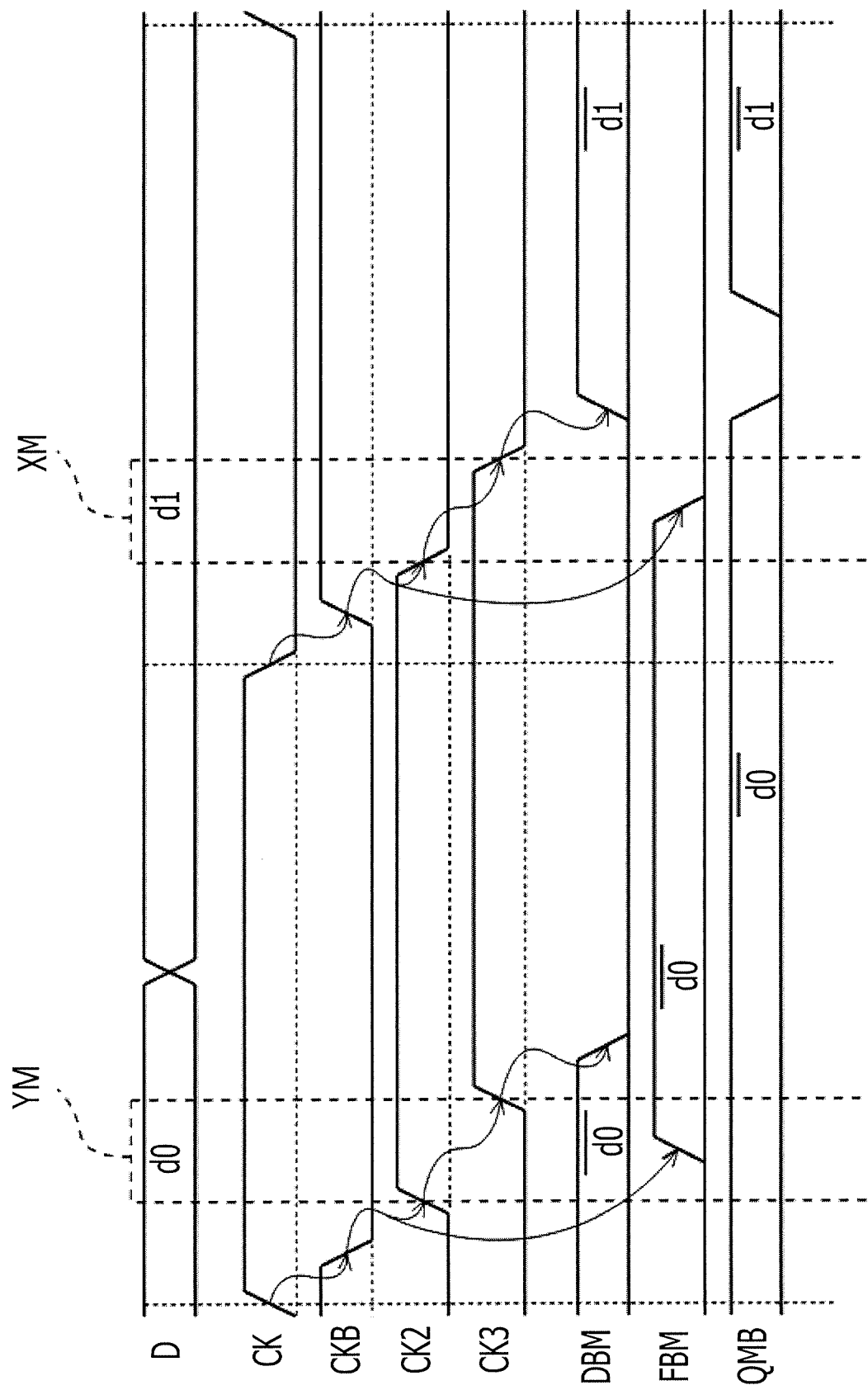
FIG. 8 illustrates an example of operation waveforms in a master unit.

FIG. 8 illustrates an example of operation waveforms in a master unit.

FIG. 9 illustrates an example of operation waveforms in a slave unit.

In FIG. 8, a through current may flow in XM. In YM, reset may be carried out.

In FIG. 8, when CK changes from H to L, CKB changes from L to H, CK2 changes from H to L, and then CK3 changes from H to L in this order. CK3 is a signal where CK2 is delayed, and there is a period XM in which CK2 is L and CK3 is H. In FIG. 6A, when the input data D that is applied to the input terminal B is L, PTr21 is ON, and thus CK2 becomes L, and CK3 becomes H. Then, PTr22 and NTr22 are turned ON, and thus a through current flows in a path in PTr21, PTr22, and NTr22. During the period XM in which CK2 is L and CK3 is H, a signal is delayed by a delay amount of two inverters that function as clock buffers, and although for a short period of time, a through current may flow and consumed current may be reduced.

In FIG. 8, when CK changes from L to H, CKB changes from H to L, CK2 changes from L to H, and then CK3 changes from L to H in this order. CK3 is a signal where CK2 is delayed, and there is a period YM in which CK2 is H and CK3 is L. CKB is L during this period YM. In FIG. 5A, since CKB is L, NOR12 inverts D2M, which is a set value, to output as FBM. Due to a gate delay, FBM changes from L in accordance with D2M during the period YM. For example, FBM does not change when D2M is L. In FIG. 6A, as CK2 changes to H, PTr22 is turned OFF, and CK3 changes to H. Then, after the period YM, NTr22 is turned ON, and thus DBM becomes L. NOR13 is in a state in which FBM is inverted and allowed to pass through.

The input data D is input so as to change after CK changes from L to H but before CK changes back from H to L. For example, a changing edge of the input data D is set around an intermediary point between a rising edge and a falling edge of CK. The timing may be shifted, and the changing edge of the input data D from L to H may occur before or during the period YM. In FIG. 6A, when the input data D that is applied to the input terminal B is L, PTr21 is ON, and NTr21 is OFF. During the period YM, since CK2 is H and CK3 is L, PTr22 and NTr22 are turned OFF. Thus, a through current does not flow, and DBM enters a high impedance state. Here, when the input data D changes from L to H, PTr21 is turned OFF, and NTr21 is turned ON. Thus, DBM becomes L. In FIG. 5A, although FBM changes from L to a state that accords with D2M during the period YM, DBM may change to L prior to FBM changing. In this case, the inputs to NOR13 are both L, and D2M changes to H. D2M is fed back, and FBM becomes L regardless of a set value. For example, although a value set as the input data D is L, H may be set, and thus the data may be damaged.

In the slave unit as well, a through current may flow during a period XS illustrated in FIG. 9. During a period YS illustrated in FIG. 9, when the intermediary data QMB from the master unit changes before or during the period YS, the data may be damaged. First and second problem causing mechanisms in the slave unit are similar to those in the master unit, and thus detailed description thereof is omitted.

Figure 10A:
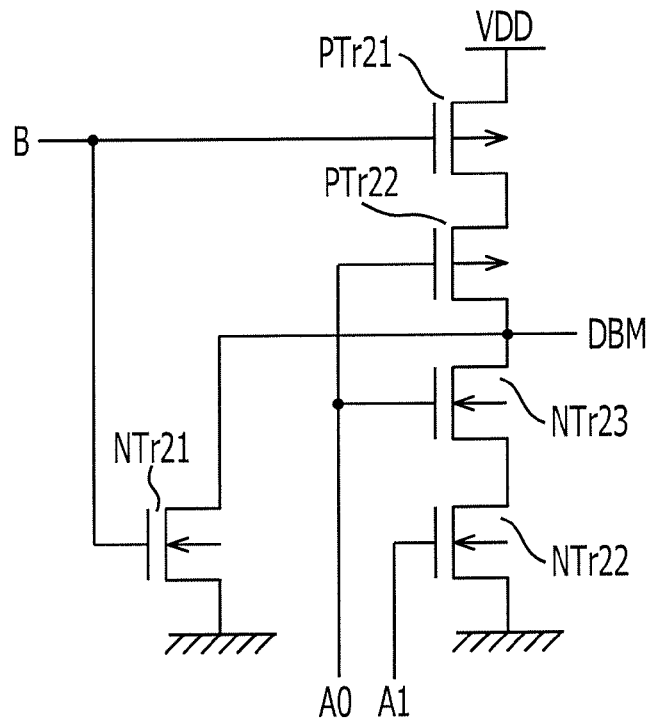
FIGS. 10A and 10B illustrate an example of a master-slave flip-flop circuit.
Figure 10B:
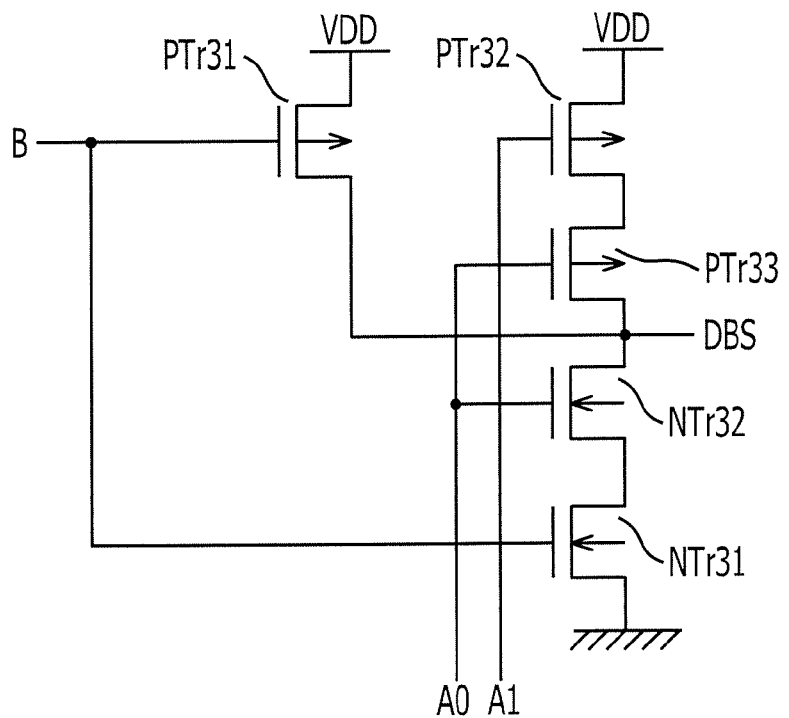

FIGS. 10A and 10B illustrate an example of a master-slave flip-flop circuit. FIG. 10A illustrates NOR11 of the master unit 30. FIG. 10B illustrates NAND11 of the slave unit 31.

The master-slave flip-flop circuit illustrated in FIGS. 10A and 10B may include elements that are substantially the same as or similar to the elements of the master-slave flip-flop circuit illustrated in FIGS. 5A and 5B.

As compared to FIG. 6A, in NOR11 of the master-slave flip-flop circuit illustrated in FIG. 10A, NTr23 having a gate to which CK2 is applied is added between the output node that outputs DBM and NTr22. NTr23 may correspond to a third NMOS transistor of a master unit. Since CK2 is applied to the gates of PTr22 and NTr23, PTr22 and NTr23 are not turned ON at the same time, and thus a through current may not flow. When CK3 changes from L to H after CK2 changes from L to H, PTr22 changes from ON to OFF. The output node (DBM) is separated from VDD regardless of the input data, and thus NTr23 is turned ON. Further, NTr22 is turned ON, and thus the output node becomes L. Since the timing at which the output node (DBM) becomes L does not change, a problem may not occur. When CK3 changes from H to L after CK2 changes from H to L, PTr22 changes from OFF to ON, and NTr22 and NTr23 change from ON to OFF. However, even if NTr23 changes to OFF prior to NTr22 changing to OFF, a problem in the operation may not occur.

As compared to FIG. 6B, in NAND11 of the master-slave flip-flop circuit illustrated in FIG. 10B, PTr33 having a gate to which CK2 is applied is provided between the output node that outputs DBS and PTr32. The operation may be substantially the same as or similar to that of NAND11 illustrated in FIG. 6B. PTr33 may correspond to a third PMOS transistor of a slave unit.

The master-slave flip-flop circuit illustrated in FIGS. 10A and 10B may have functions that are substantially the same as or similar to those of the master-slave flip-flop circuit illustrated in FIGS. 6A and 6B, and a through current may be reduced.

Figure 11A:
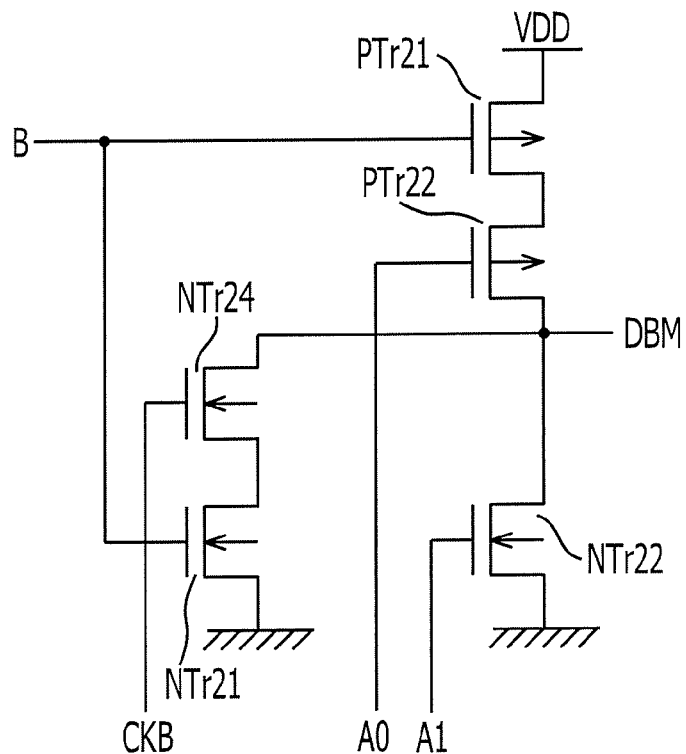
FIGS. 11A and 11B illustrate an example of a master-slave flip-flop circuit.
Figure 11B:
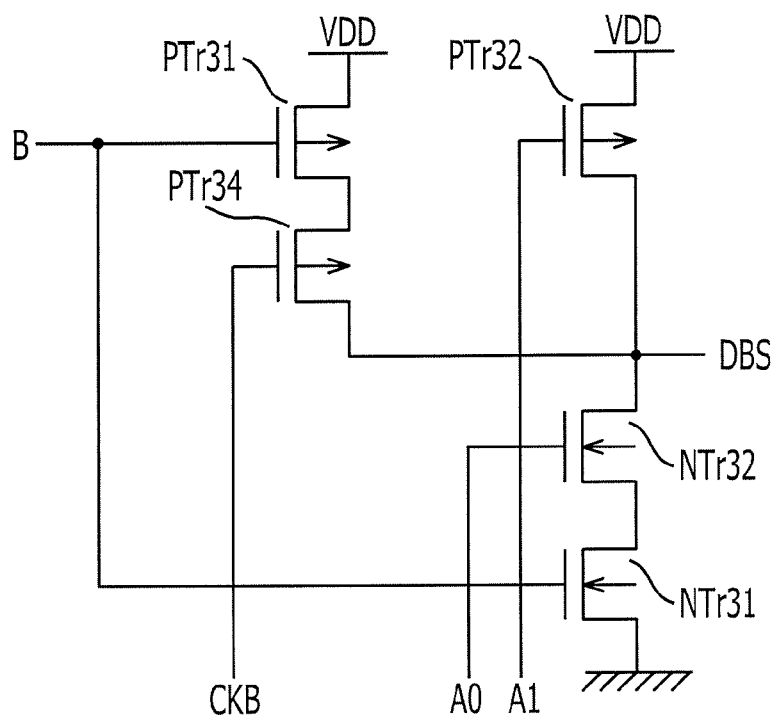

FIGS. 11A and 11B illustrate an example of a master-slave flip-flop circuit. FIG. 11A illustrates NOR11 of the master unit 30. FIG. 11B illustrates NAND11 of the slave unit 31.

The master-slave flip-flop circuit illustrated in FIGS. 11A and 11B may include elements that are substantially the same as or similar to the elements of the master-slave flip-flop circuit illustrated in FIGS. 6A and 6B.

In comparison with FIG. 6A, in NOR11 of the master-slave flip-flop circuit illustrated in FIG. 11A, NTr24 having a gate to which CK2 is applied is added between the output node that outputs DBM and NTr21. NTr24 may correspond to a fourth NMOS transistor of a master unit. Since CKB is applied to the gate of NTr24, when CKB is L, NTr24 is OFF. Accordingly, even if the input data D changes from L to H before or during the period YM illustrated in FIG. 8, DBM may not change to L. If CK changes from H to L when the input data D is H, CKB then changes to H, and thus DBM changes to L in accordance with the input data D. The input data D is inverted into DBM and further inverted to be set to D2M, which may enable normal operation.

In comparison with FIG. 6B, in NAND11 of the master-slave flip-flop circuit illustrated in FIG. 11B, PTr34 having a gate to which CKB is applied is added between the output node that outputs DBS and PTr31. The operation may be substantially the same as or similar to that of NOR11. PTr34 may correspond to a fourth PMOS transistor of a slave unit.

The master-slave flip-flop circuit illustrated in FIGS. 11A and 11B may have functions that are substantially the same as or similar to those of the master-slave flip-flop circuit illustrated in FIGS. 6A and 6B, and the output may not be reset as the input data changes around a changing edge of a clock.

Figure 12A:
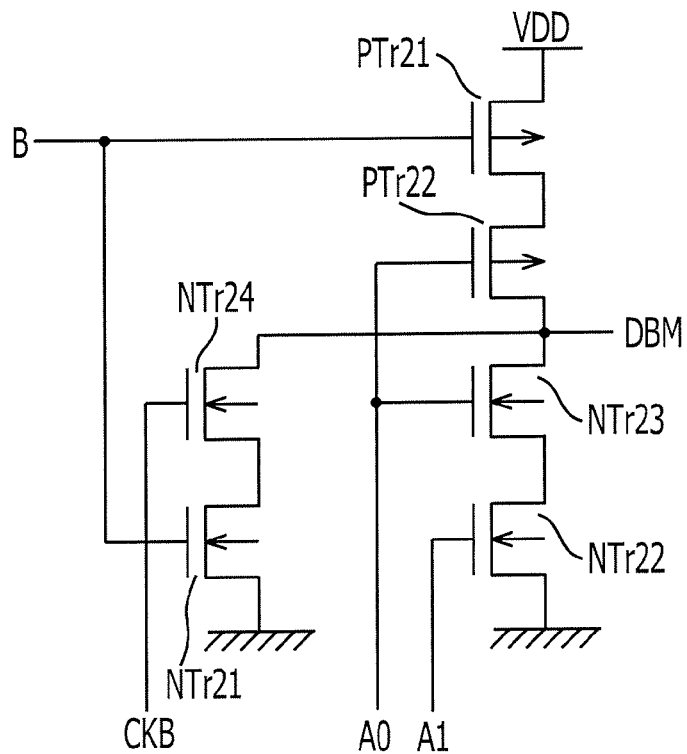
FIGS. 12A and 12B illustrate an example of a master-slave flip-flop circuit.
Figure 12B:
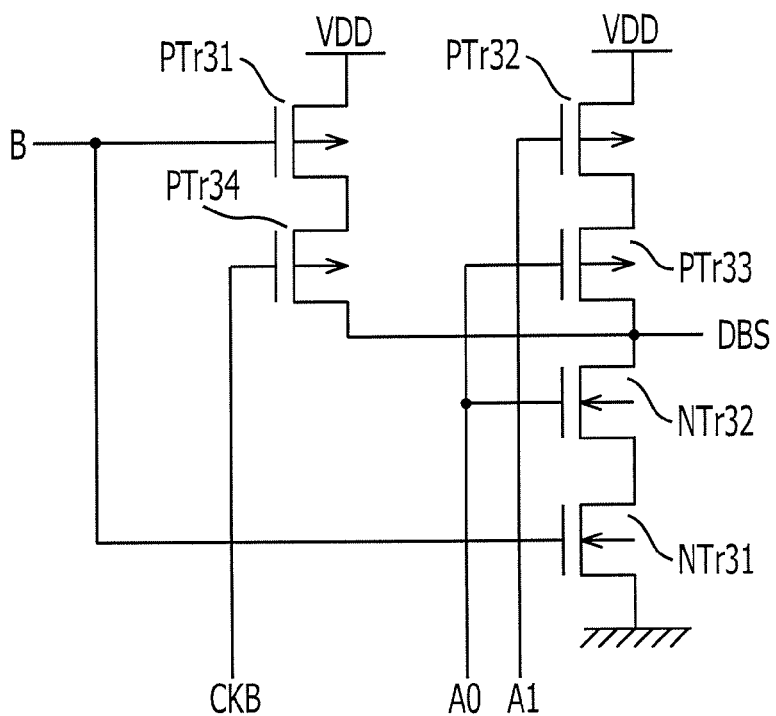

FIGS. 12A and 12B illustrate an example of a master-slave flip-flop circuit. In FIGS. 12A and 12B, NTr23 and PTr33 illustrated in FIGS. 10A and 10B and NTr24 and PTr34 illustrated in FIGS. 11A and 11B are all added. FIG. 12A illustrates NOR11. FIG. 12B illustrates NAND11. The master-slave flip-flop circuit illustrated in FIGS. 12A and 12B may carry out an operation that is substantially the same as or similar to the operation of the master-slave flip-flop circuits illustrated in FIGS. 10A, 10B, 11A, and 11B.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A master-slave flip-flop circuit comprising:
a master circuit configured to receive input data in a first state of a reference clock and hold the input data in a second state of the reference clock to output intermediary data; and
a slave circuit configured to receive the intermediary data in the second state of the reference clock and hold the intermediary data in the first state of the reference clock to output data, wherein the master circuit includes:
a feedback two-input NOR gate configured to receive an output of the master circuit and a first clock obtained by delaying the reference clock by a first delay amount that is less than a second delay amount and then inverted;
an input three-input NOR gate configured to receive the input data, a second clock obtained by delaying the reference clock by the second delay amount, and a third clock obtained by delaying the reference clock by a third delay amount that is greater than the second delay amount; and
a synthesis two-input NOR gate configured to receive an output of the input three-input NOR gate and an output of the feedback two-input NOR gate.

2. The master-slave flip-flop circuit according to claim 1, wherein the input three-input NOR gate includes:
a first PMOS transistor and a second PMOS transistor coupled in series between a high potential side power supply and an output terminal: and
a first NMOS transistor and a second NMOS transistor coupled in parallel between the output terminal and a low potential side power supply.

3. The master-slave flip-flop circuit according to claim 2, wherein
the input data is applied to gates of the first PMOS transistor and the first NMOS transistor,
the second clock is applied to a gate of the second PMOS transistor, and
the third clock is applied to a gate of the second NMOS transistor.

4. The master-slave flip-flop circuit according to claim 1, wherein the slave circuit includes:
an input three-input NAND gate configured to receive the intermediary data, the second clock, and the third clock;
a feedback two-input NAND gate configured to receive an output of the slave circuit and the first clock; and
a synthesis two-input NAND gate configured to receive an output of the input three-input NAND gate and an output of the feedback two-input NAND gate.

5. The master-slave flip-flop circuit according to claim 4, wherein the input three-input NAND gate includes:
a first PMOS transistor and a second PMOS transistor that coupled in parallel between a high potential side power supply and an output terminal; and
a first NMOS transistor and a second NMOS transistor coupled in series between the output terminal and a low potential side power supply.

6. The master-slave flip-flop circuit according to claim 5, wherein
the intermediary data is applied to gates of the first PMOS transistor and the first NMOS transistor,
the second clock is applied to a gate of the second NMOS transistor, and
the third clock is applied to a gate of the second PMOS transistor.

7. The master-slave flip-flop circuit according to claim 6, wherein
the input three-input NOR gate of the master circuit includes a third NMOS transistor coupled between the output terminal and a second NMOS transistor and to a gate of which the second clock is applied and
the input three-input NAND gate of the slave circuit includes a third PMOS transistor coupled between the second PMOS transistor and the output terminal and to a gate of which the second clock is applied.

8. The master-slave flip-flop circuit according to claim 6, wherein
the input three-input NOR gate of the master circuit includes a fourth NMOS transistor coupled between the output terminal and a first NMOS transistor and to a gate of which the first clock is applied, and
the input three-input NAND gate of the slave circuit includes a fourth PMOS transistor coupled between the first PMOS transistor and the output terminal and to a gate of which the first clock is applied.

* * * * *